United States Patent
Lee et al.

(10) Patent No.: US 12,446,631 B2
(45) Date of Patent: Oct. 21, 2025

(54) AEROSOL GENERATING DEVICE

(71) Applicant: KT&G CORPORATION, Daejeon (KR)

(72) Inventors: Jae Min Lee, Gyeonggi-do (KR); Sang Kyu Park, Seoul (KR)

(73) Assignee: KT&G Corporation, Daejeon (KR)

( * ) Notice: Subject to any disclaimer, the term of this patent is extended or adjusted under 35 U.S.C. 154(b) by 94 days.

(21) Appl. No.: 17/928,225

(22) PCT Filed: Aug. 8, 2022

(86) PCT No.: PCT/KR2022/011759
§ 371 (c)(1),
(2) Date: Nov. 28, 2022

(87) PCT Pub. No.: WO2023/027381
PCT Pub. Date: Mar. 2, 2023

(65) Prior Publication Data
US 2024/0237750 A1 Jul. 18, 2024

(30) Foreign Application Priority Data

Aug. 27, 2021 (KR) .................. 10-2021-0114246

(51) Int. Cl.
*A24F 40/51* (2020.01)
*A24F 40/20* (2020.01)
(Continued)

(52) U.S. Cl.
CPC ............ *A24F 40/51* (2020.01); *A24F 40/465* (2020.01); *A24F 40/20* (2020.01); *A24F 40/65* (2020.01)

(58) Field of Classification Search
None
See application file for complete search history.

(56) References Cited

U.S. PATENT DOCUMENTS 9,411,474 B2   8/2016   Rauhala et al.
2010/0180665 A1  7/2010   Abe et al.
(Continued)

FOREIGN PATENT DOCUMENTS

EP    3 610 747 A2    2/2020
JP    H6-295772 A    10/1994
(Continued)

OTHER PUBLICATIONS

English machine translation of WO 2016070553 to Li published May 12, 2016; A24F 40/485. 53 pages. (Year: 2016).*
(Continued)

*Primary Examiner* — Linda L Gray
(74) *Attorney, Agent, or Firm* — Foley & Lardner LLP

(57) ABSTRACT

An aerosol generating device includes a housing including an accommodation space for receiving an aerosol generating article, a heater configured to heat the aerosol generating article inserted into the accommodation space to generate an aerosol, a sensor configured to generate a sensing signal corresponding to a change in capacitance of the accommodation space, and a processor electrically connected to the heater and the sensor, wherein the sensor includes a printed circuit board disposed to surround at least a part of an outer circumferential surface of the accommodation space, an electrode disposed on one region of the printed circuit board and configured to generate the sensing signal corresponding to the change in capacitance of the accommodation space, and ground disposed in another region of the printed circuit board located in a direction opposite to the one region, and the electrode being electrically connected to the ground to shield noise.

15 Claims, 9 Drawing Sheets

(51) Int. Cl.
*A24F 40/465* (2020.01)
*A24F 40/65* (2020.01)

(56) References Cited

U.S. PATENT DOCUMENTS

| | | | |
|---|---|---|---|
| 2015/0077981 A1* | 3/2015 | Cormack | A24F 40/70 |
| | | | 29/874 |
| 2018/0177238 A1 | 6/2018 | Bessant et al. | |
| 2018/0245919 A1 | 8/2018 | Yoshida et al. | |
| 2021/0015167 A1 | 1/2021 | Moloney et al. | |
| 2021/0059306 A1 | 3/2021 | Chen et al. | |
| 2021/0161212 A1 | 6/2021 | Jeong et al. | |
| 2021/0199432 A1 | 7/2021 | Bessant et al. | |

FOREIGN PATENT DOCUMENTS

| | | |
|---|---|---|
| JP | 2010-164556 A | 7/2010 |
| JP | 2013-254759 A | 12/2013 |
| JP | 2017-40619 A | 2/2017 |
| JP | 2020-501552 A | 1/2020 |
| JP | 2021-516986 A | 7/2021 |
| KP | 10-2019-0089908 A | 7/2019 |
| KR | 10-1573377 B1 | 12/2015 |
| KR | 10-1724978 B1 | 4/2017 |
| KR | 10-2021-0101045 A | 8/2021 |
| WO | 2014/058678 A1 | 4/2014 |
| WO | 2016/017024 A1 | 2/2016 |
| WO | 2018/114849 A1 | 6/2018 |
| WO | 2021/116994 A1 | 6/2021 |
| WO | 2021/157841 A1 | 8/2021 |

OTHER PUBLICATIONS

Korean Office Action dated Jan. 2, 2024 in Application No. 10-2021-0114246.
Japanese Office Action dated Jan. 23, 2024 in Application No. 2023-501543.
Extended European Search Report issued Sep. 18, 2023 in European Application No. 22802860.1.
Written Opinion for PCT/KR2022/011759, dated Nov. 10, 2022.
International Search Report for PCT/KR2022/011759, dated Nov. 10, 2022.

* cited by examiner

[Fig. 1]
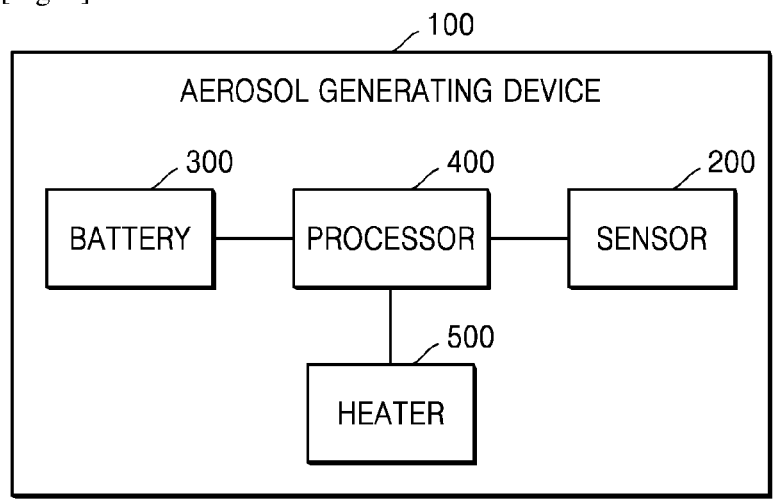
[Fig. 2]
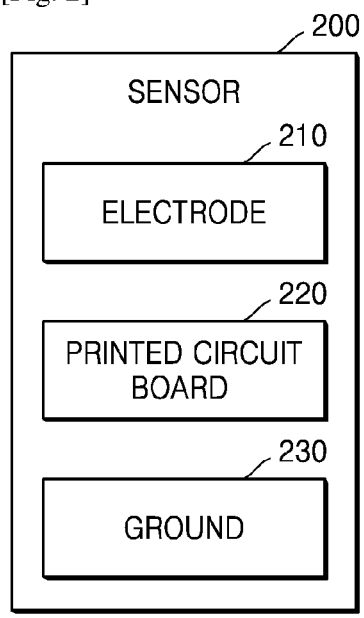

[Fig. 3]
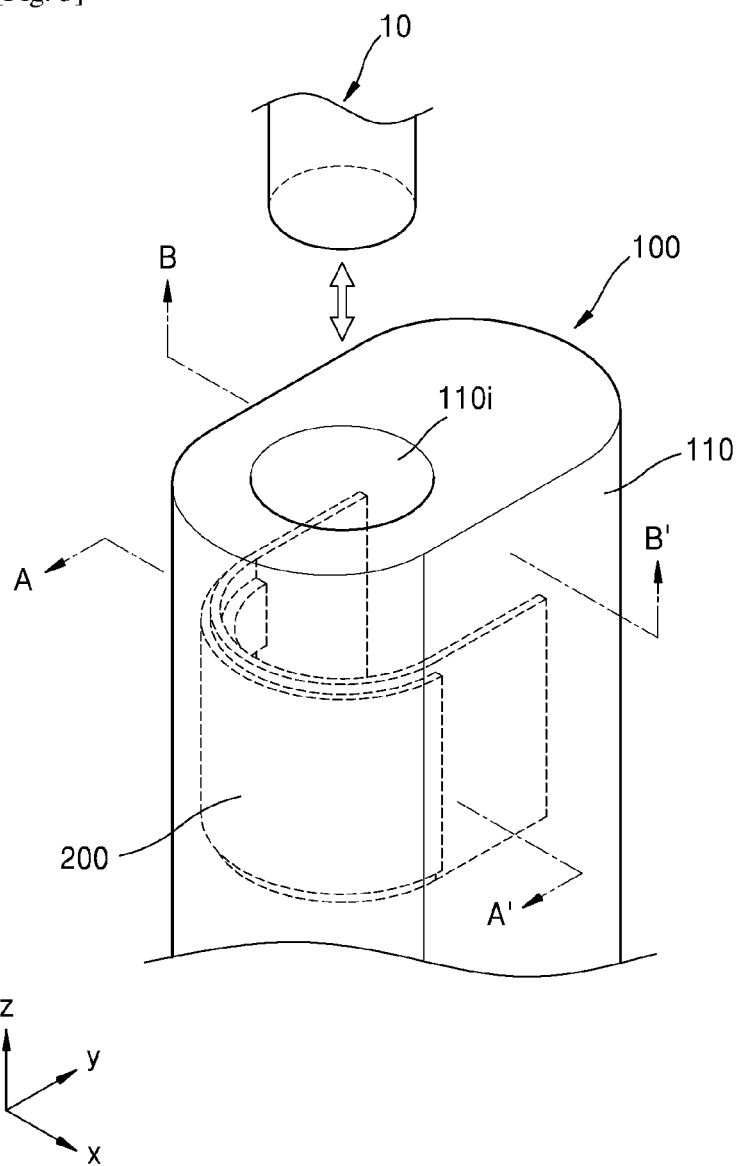

[Fig. 4A]
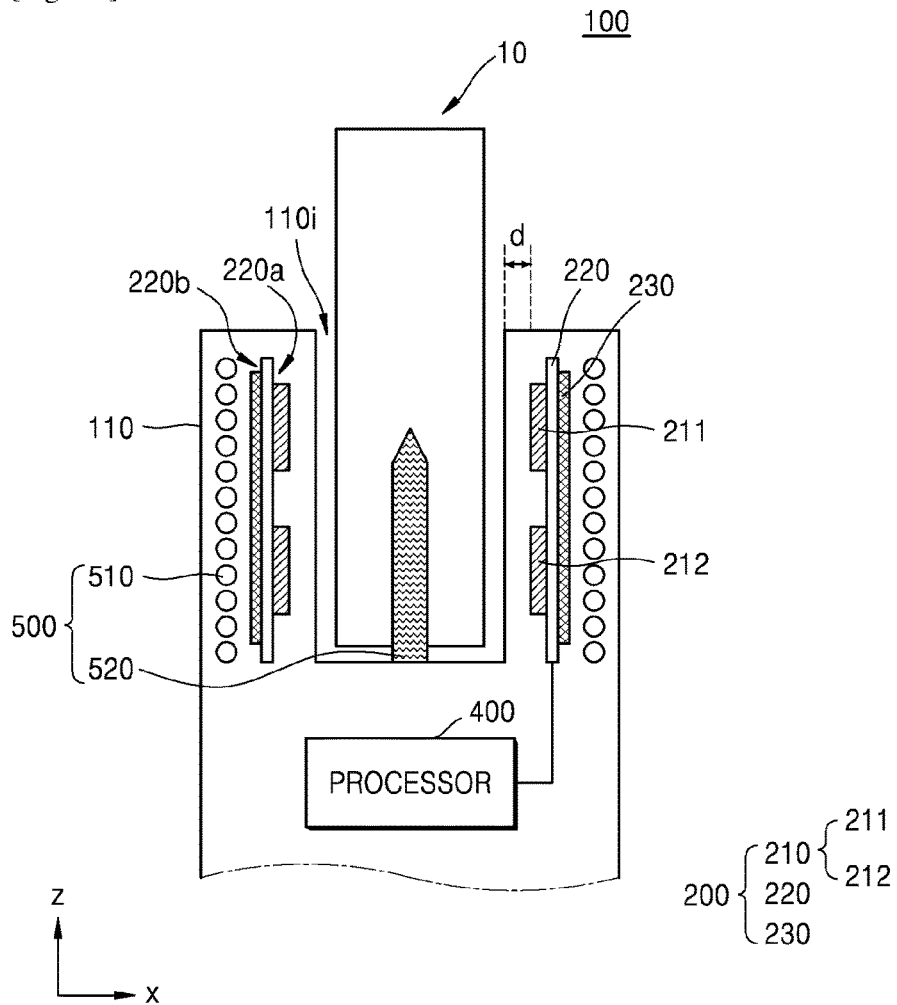
[Fig. 4B]
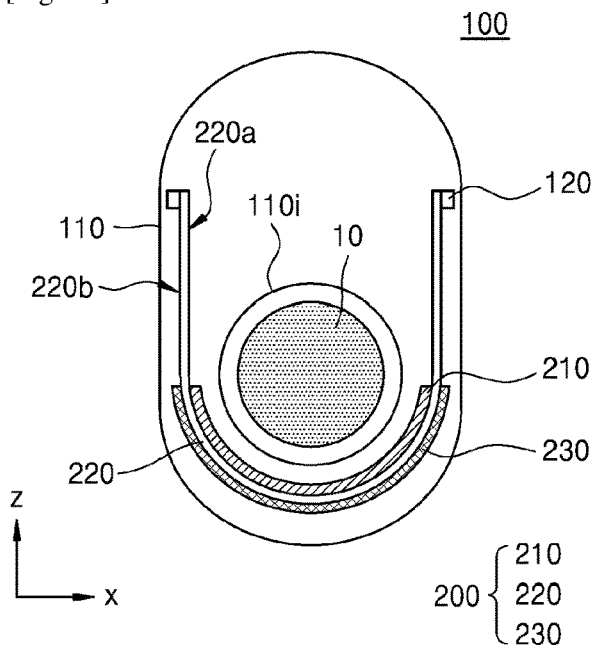

[Fig. 5]
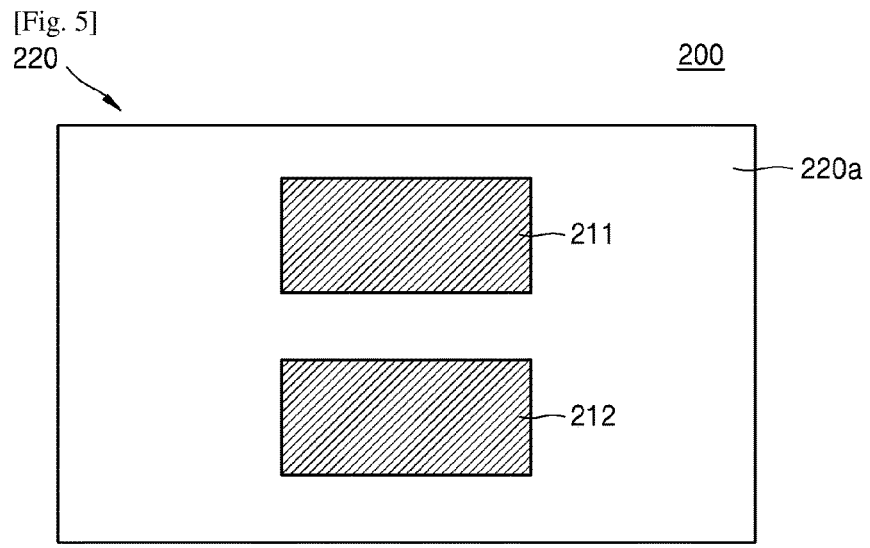
[Fig. 6]
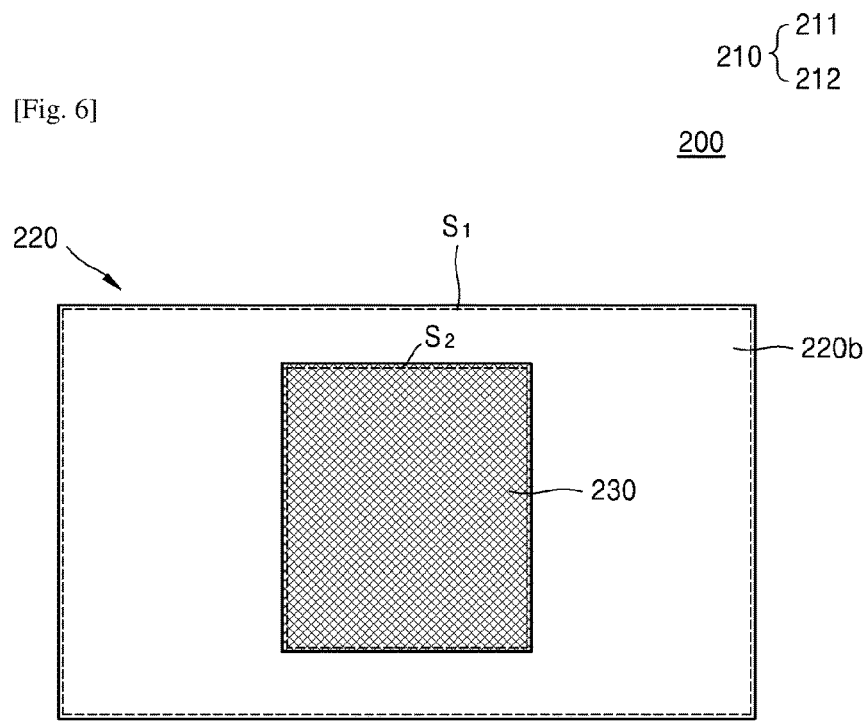
[Fig. 7A]
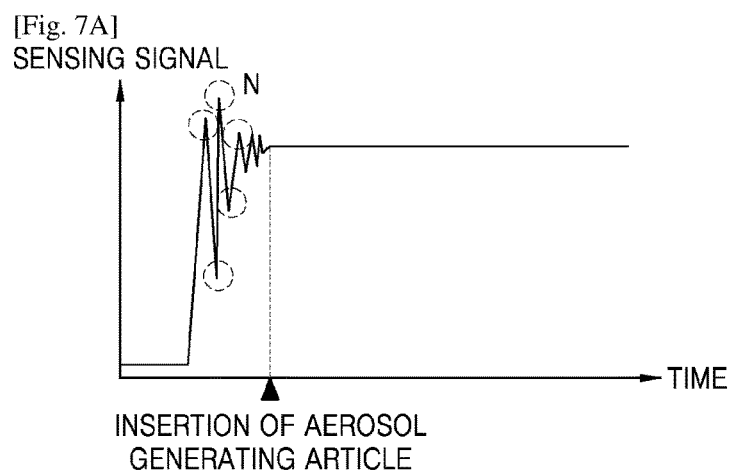

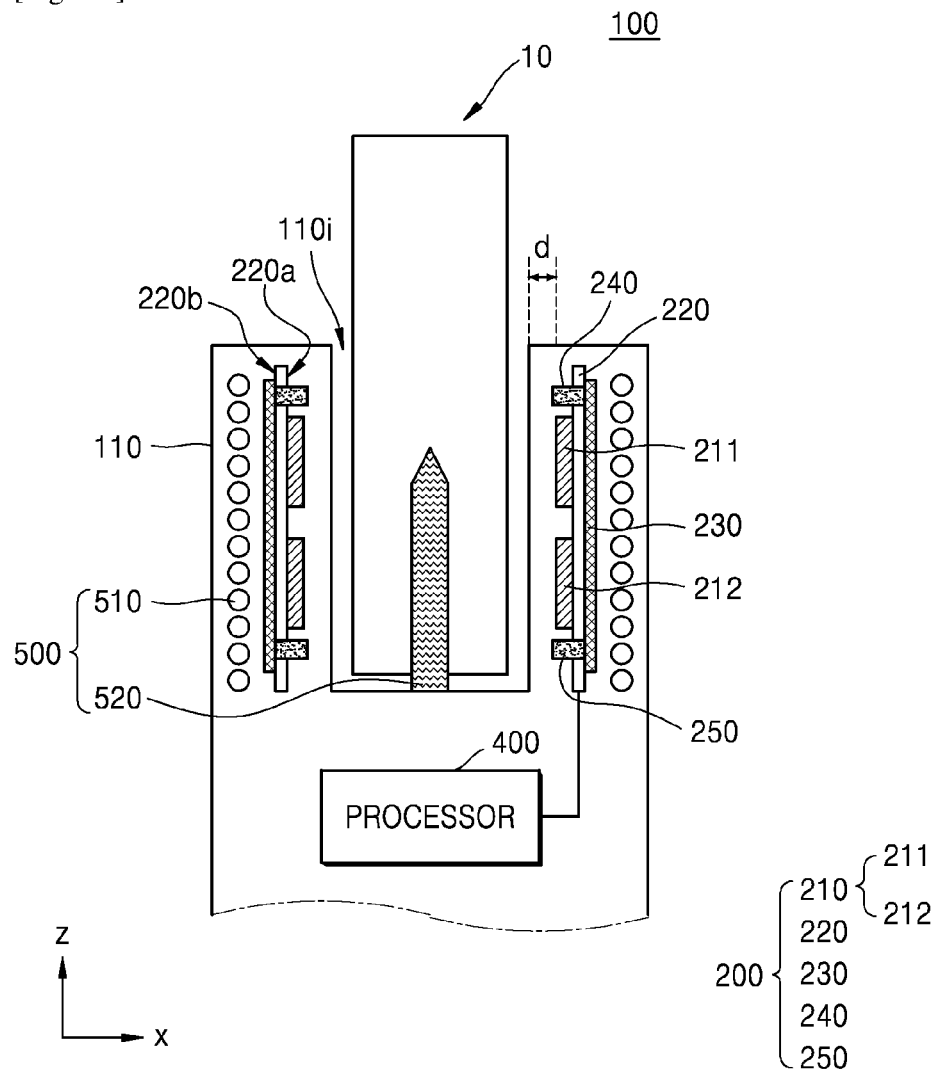

[Fig. 8B]
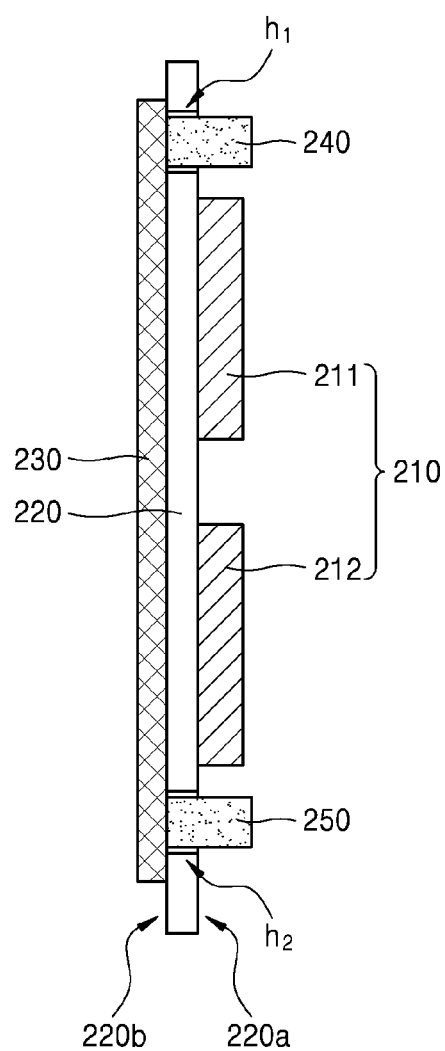

[Fig. 9]
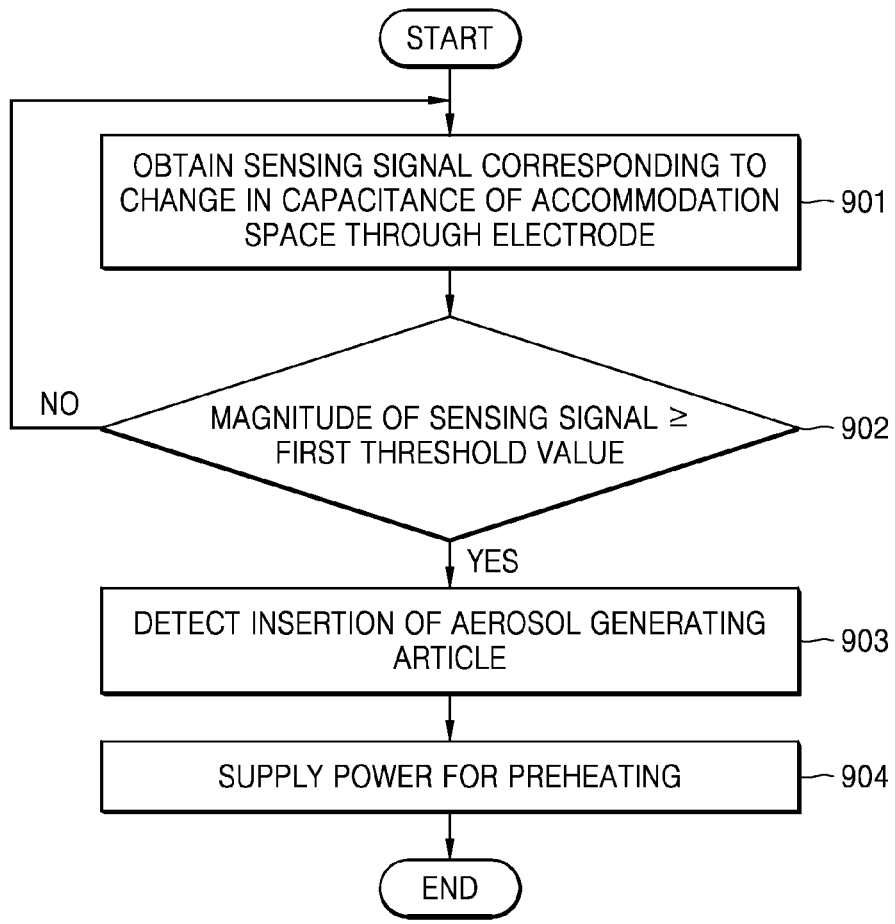
[Fig. 10]
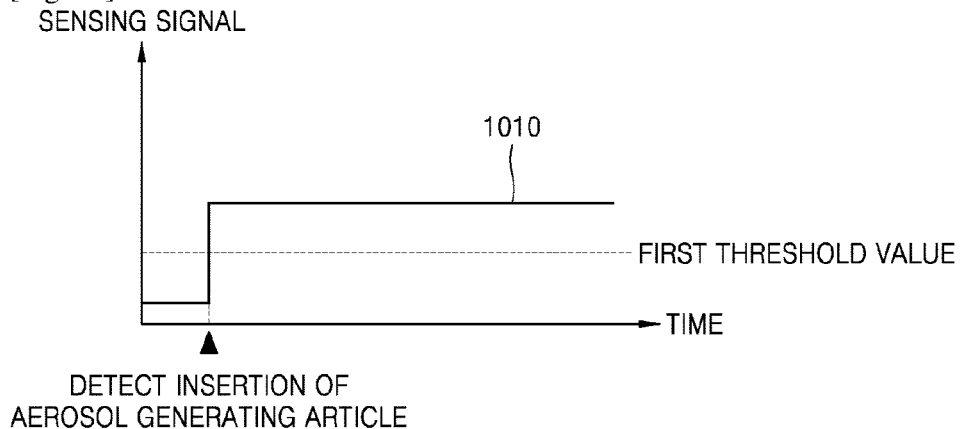

[Fig. 11]
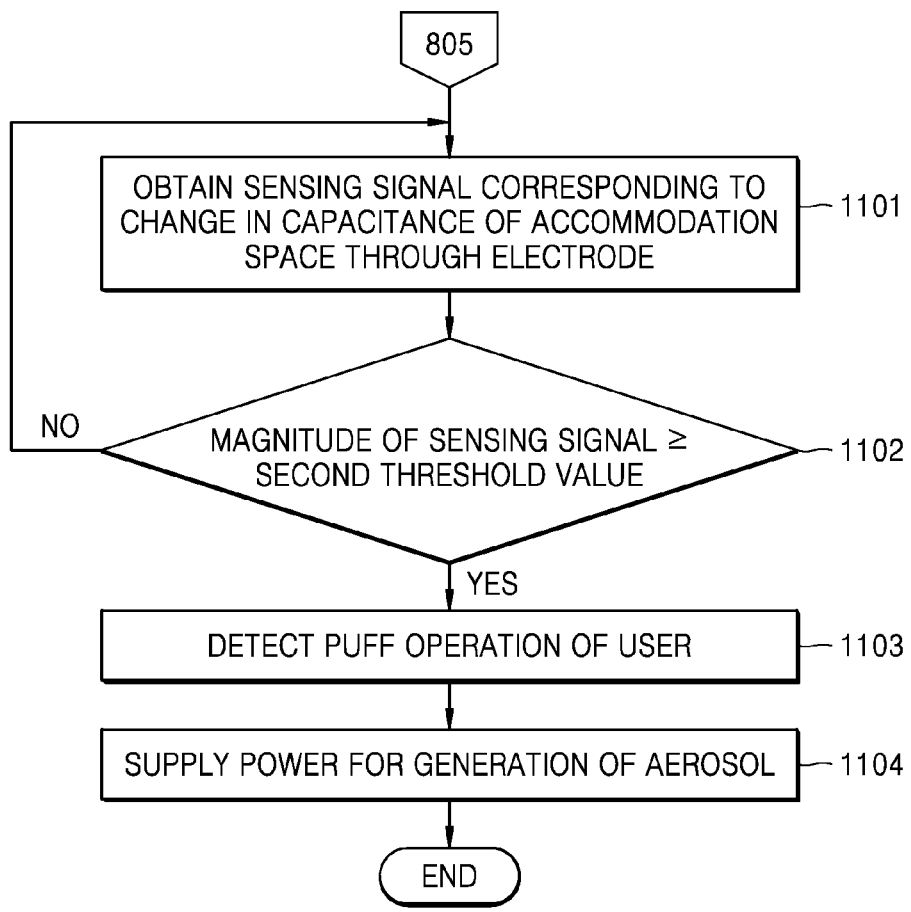
[Fig. 12]
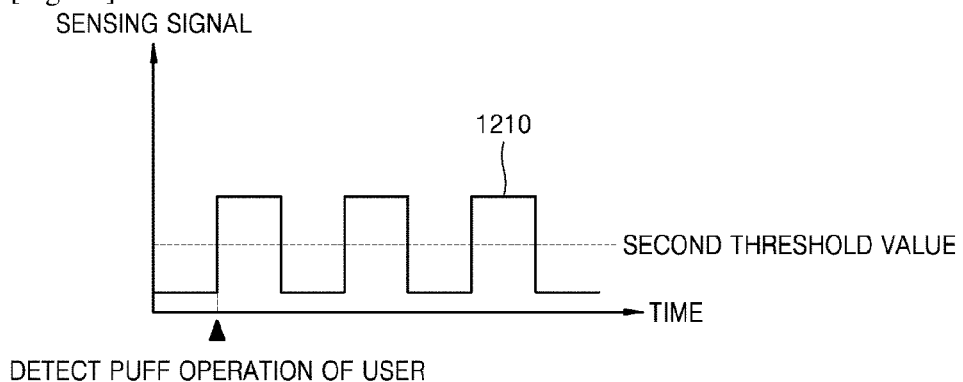

[Fig. 13]
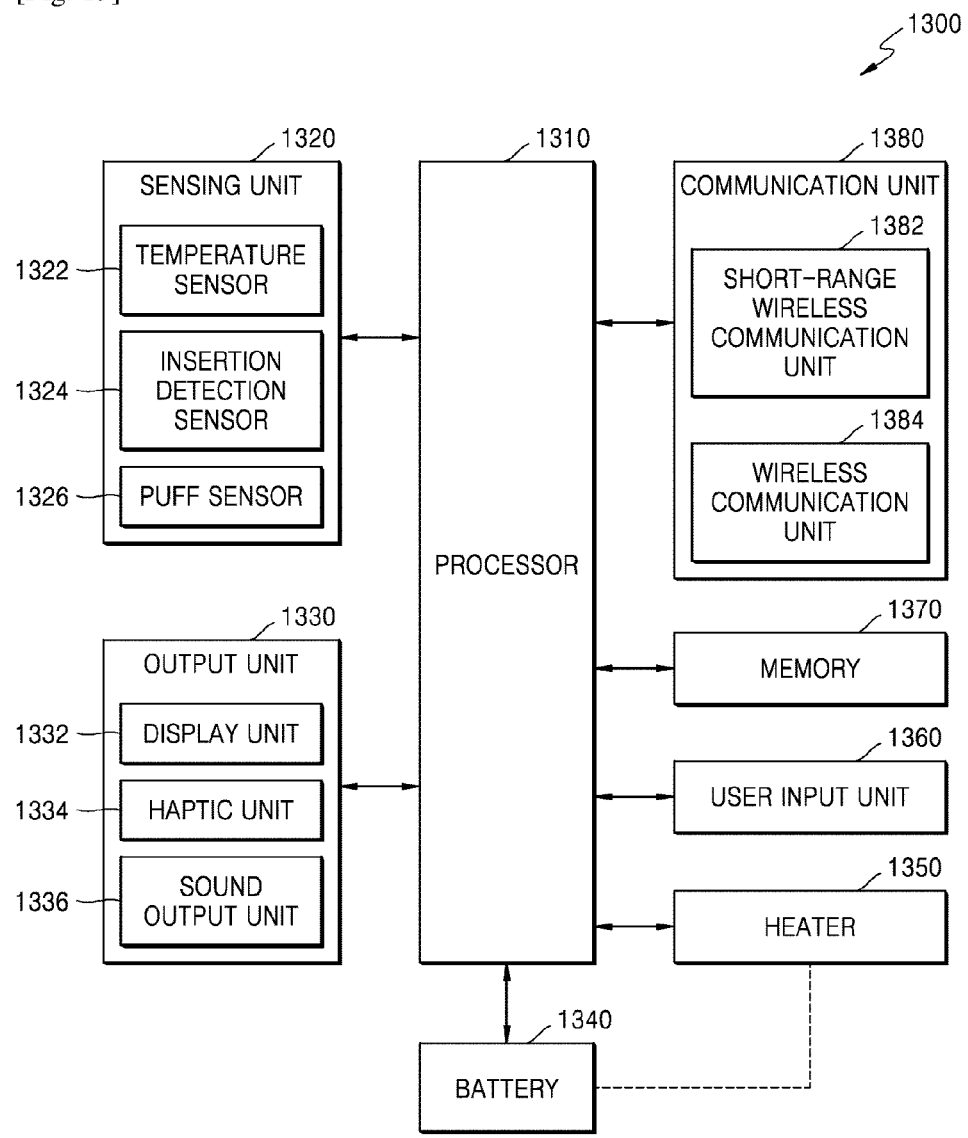

AEROSOL GENERATING DEVICE

CROSS REFERENCE TO RELATED APPLICATIONS

This application is a National Stage of International Application No. PCT/KR2022/011759 filed Aug. 8, 2022, claiming priority based on Korean Patent Application No. 10-2021-0114246 filed Aug. 27, 2021.

TECHNICAL FIELD

Embodiments relate to an aerosol generating device, and more particularly, to an aerosol generating device capable of increasing the measurement accuracy of a sensor by shielding noise introduced into the sensor.

BACKGROUND ART

Recently, the demand for alternative methods for overcoming the shortcomings of general cigarettes has increased. For example, there is an increasing demand for a system for generating aerosols by heating a cigarette or an aerosol generating material by using an aerosol generating device, rather than by burning cigarettes.

Recently, an aerosol generating device that may generate an aerosol by heating an aerosol generating article has been suggested as a way to replace a method of supplying an aerosol by burning cigarettes. However, in the case of such an aerosol generating device, power may be wasted unnecessarily since a heater operates even when an aerosol generating article is not inserted in the aerosol generating device, or it may take a long time for the temperature of the aerosol generating article to reach a target temperature since the heater does not operate even when the aerosol generating article is inserted in the aerosol generating device.

That is, when the aerosol generating device that heats the aerosol generating article does not detect whether the aerosol generating article is inserted or accommodated therein, since unnecessary power loss or a delay in smoking time may occur, there is a need for a method capable of precisely detecting whether the aerosol generating article is inserted in the aerosol generating device.

DISCLOSURE OF INVENTION

Technical Problem

An aerosol generating device capable of detecting whether an aerosol generating article is inserted or accommodated therein by using a sensor has been proposed. In the case of the aerosol generating device described above, it is difficult to precisely detect whether the aerosol generating article was inserted due to noise generated inside and outside the aerosol generating device during an operation of the aerosol generating device.

For example, in the conventional aerosol generating device, noise generated by a user's movement outside the aerosol generating device and/or noise generated during operations of components of the aerosol generating device is introduced into the sensor, because the measurement accuracy of the sensor deteriorates, it is difficult to precisely determine whether the aerosol generating article is inserted.

Accordingly, the disclosure provides an aerosol generating device capable of shielding noise introduced into a sensor, thereby improving the detection accuracy of whether an aerosol generating article is inserted.

The technical problems of the disclosure are not limited to the above-described description, and other technical problems may be clearly understood by one of ordinary skill in the art from the embodiments to be described hereinafter.

Solution to Problem

According to an aspect of the disclosure, an aerosol generating device includes a housing including an accommodation space for receiving an aerosol generating article, a heater configured to heat the aerosol generating article inserted into the accommodation space to generate an aerosol, a sensor configured to generate a sensing signal corresponding to a change in capacitance of the accommodation space, and a processor electrically connected to the heater and the sensor, wherein the sensor includes a printed circuit board disposed to surround at least a part of an outer circumferential surface of the accommodation space, an electrode disposed on one region of the printed circuit board and configured to generate the sensing signal corresponding to the change in capacitance of the accommodation space, and ground disposed in another region of the printed circuit board located in a direction opposite to the one region, the electrode being electrically connected to the ground to shield noise.

Advantageous Effects of Invention

The aerosol generating device according to embodiments of the disclosure may shield noise introduced into the sensor from the inside and/or outside of the aerosol generating device.

Accordingly, the aerosol generating device according to embodiments of the disclosure may precisely detect whether the aerosol generating article is inserted.

Effects of the disclosure are not limited to the above effects, and effects that are not mentioned could be clearly understood by one of ordinary skill in the art from the present specification and the attached drawings.

BRIEF DESCRIPTION OF DRAWINGS

FIG. 1 is a block diagram illustrating components of an aerosol generating device according to an embodiment.

FIG. 2 is a block diagram illustrating components of a sensor according to an embodiment.

FIG. 3 is a perspective view illustrating a partial region of an aerosol generating device according to an embodiment.

FIG. 4A is a cross-sectional view of the aerosol generating device of FIG. 3 taken in a direction A-A' according to an embodiment.

FIG. 4B is a cross-sectional view of the aerosol generating device of FIG. 3 taken in a direction B-B'.

FIG. 5 is a diagram illustrating a first surface of a printed circuit board of a sensor in an unfolded state of the printed circuit board according to an embodiment.

FIG. 6 is a diagram illustrating a second surface of a printed circuit board of a sensor in an unfolded state of the printed circuit board according to an embodiment.

FIG. 7A is a graph illustrating a change in a sensing signal generated by a sensor according to an embodiment.

FIG. 7B is a graph illustrating a change in a sensing signal generated by a sensor according to another embodiment.

FIG. 8A is a cross-sectional view of the aerosol generating device of FIG. 3 cut in the direction A-A' according to another embodiment.

FIG. 8B is an enlarged view illustrating an enlarged cross-section of a sensor of the aerosol generating device of FIG. 8A.

FIG. 9 is a flowchart illustrating a method, performed by an aerosol generating device, of detecting insertion of an aerosol generating article according to an embodiment.

FIG. 10 is a graph illustrating a change in a sensing signal obtained from a sensor of an aerosol generating device over time according to an embodiment.

FIG. 11 is a flowchart illustrating a method, performed by an aerosol generating device, of detecting a puff operation of a user according to another embodiment.

FIG. 12 is a graph illustrating a change in a sensing signal obtained from a sensor of the aerosol generating device over time according to another embodiment.

FIG. 13 is a block diagram illustrating components of an aerosol generating device according to another embodiment.

MODE FOR THE INVENTION

Regarding the terms in the various embodiments, the general terms which are currently and widely used are selected in consideration of functions of structural elements in the various embodiments of the disclosure. However, meanings of the terms can be changed according to intention, a judicial precedence, the appearance of a new technology, and the like. In addition, in certain cases, terms which can be arbitrarily selected by the applicant in particular cases. In such a case, the meaning of the terms will be described in detail at the corresponding portion in the description of the disclosure. Therefore, the terms used in the various embodiments of the disclosure should be defined based on the meanings of the terms and the descriptions provided herein.

In addition, unless explicitly described to the contrary, the word "comprise" and variations such as "comprises" or "comprising" will be understood to imply the inclusion of stated elements but not the exclusion of any other elements. In addition, the terms "-er", "-or", and "module" described in the specification mean units for processing at least one function and operation and can be implemented by hardware components or software components and combinations thereof.

As used herein, when an expression such as "at least any one" precedes arranged elements, it modifies all elements rather than each arranged element. For example, the expression "at least any one of a, b, and c" should be construed to include a, b, c, or a and b, a and c, b and c, or a, b, and c.

In an embodiment, an aerosol generating device may be a device that generates aerosols by electrically heating a cigarette accommodated in an interior space thereof.

The aerosol generating device may include a heater. In an embodiment, the heater may be an electro-resistive heater. For example, the heater may include an electrically conductive track, and the heater may be heated when currents flow through the electrically conductive track.

The heater may include a tube-shaped heating element, a plate-shaped heating element, a needle-shaped heating element, or a rod-shaped heating element, and may heat the inside or outside of a cigarette according to the shape of a heating element.

A cigarette may include a tobacco rod and a filter rod. The tobacco rod may be formed of sheets, strands, and tiny bits cut from a tobacco sheet. Also, the tobacco rod may be surrounded by a heat conductive material. For example, the heat conductive material may be, but is not limited to, a metal foil such as aluminum foil.

The filter rod may include a cellulose acetate filter. The filter rod may include at least one segment. For example, the filter rod may include a first segment configured to cool aerosols, and a second segment configured to filter a certain component in aerosols.

In another embodiment, the aerosol generating device may be a device that generates aerosols by using a cartridge containing an aerosol generating material.

The aerosol generating device may include a cartridge that contains an aerosol generating material, and a main body that supports the cartridge. The cartridge may be detachably coupled to the main body, but is not limited thereto. The cartridge may be integrally formed or assembled with the main body, and may also be fixed to the main body so as not to be detached from the main body by a user. The cartridge may be mounted on the main body while accommodating an aerosol generating material therein. However, the disclosure is not limited thereto. An aerosol generating material may also be injected into the cartridge while the cartridge is coupled to the main body.

The cartridge may contain an aerosol generating material in any one of various states, such as a liquid state, a solid state, a gaseous state, a gel state, or the like. The aerosol generating material may include a liquid composition. For example, the liquid composition may be a liquid including a tobacco-containing material having a volatile tobacco flavor component, or a liquid including a non-tobacco material.

The cartridge may be operated by an electrical signal or a wireless signal transmitted from the main body to perform a function of generating aerosols by converting the phase of an aerosol generating material inside the cartridge into a gaseous phase. The aerosols may refer to a gas in which vaporized particles generated from an aerosol generating material are mixed with air.

In another embodiment, the aerosol generating device may generate aerosols by heating a liquid composition, and generated aerosols may be delivered to a user through a cigarette. That is, the aerosols generated from the liquid composition may move along an airflow passage of the aerosol generating device, and the airflow passage may be configured to allow aerosols to be delivered to a user by passing through a cigarette.

In another embodiment, the aerosol generating device may be a device that generates aerosols from an aerosol generating material by using an ultrasonic vibration method. At this time, the ultrasonic vibration method may mean a method of generating aerosols by converting an aerosol generating material into aerosols with ultrasonic vibration generated by a vibrator.

The aerosol generating device may include a vibrator, and generate a short-period vibration through the vibrator to convert an aerosol generating material into aerosols. The vibration generated by the vibrator may be ultrasonic vibration, and the frequency band of the ultrasonic vibration may be in a frequency band of about 100 kHz to about 3.5 MHz, but is not limited thereto.

The aerosol generating device may further include a wick that absorbs an aerosol generating material. For example, the wick may be arranged to surround at least one area of the vibrator, or may be arranged to contact at least one area of the vibrator.

As a voltage (for example, an alternating voltage) is applied to the vibrator, heat and/or ultrasonic vibrations may be generated from the vibrator, and the heat and/or ultrasonic vibrations generated from the vibrator may be transmitted to the aerosol generating material absorbed in the wick. The aerosol generating material absorbed in the wick may be converted into a gaseous phase by heat and/or ultrasonic vibrations transmitted from the vibrator, and as a result, aerosols may be generated.

For example, the viscosity of the aerosol generating material absorbed in the wick may be lowered by the heat generated by the vibrator, and as the aerosol generating material having a lowered viscosity is granulated by the ultrasonic vibrations generated from the vibrator, aerosols may be generated, but is not limited thereto.

In another embodiment, the aerosol generating device is a device that generates aerosols by heating an aerosol generating article accommodated in the aerosol generating device in an induction heating method.

The aerosol generating device may include a susceptor and a coil. In an embodiment, the coil may apply a magnetic field to the susceptor. As power is supplied to the coil from the aerosol generating device, a magnetic field may be formed inside the coil. In an embodiment, the susceptor may be a magnetic body that generates heat by an external magnetic field. As the susceptor is positioned inside the coil and a magnetic field is applied to the susceptor the susceptor generates heat to heat an aerosol generating article. In addition, optionally, the susceptor may be positioned within the aerosol generating article.

In another embodiment, the aerosol generating device may further include a cradle.

The aerosol generating device may configure a system together with a separate cradle. For example, the cradle may charge a battery of the aerosol generating device. Alternatively, the heater may be heated when the cradle and the aerosol generating device are coupled to each other.

Hereinafter, the disclosure will now be described more fully with reference to the accompanying drawings, in which embodiments of the disclosure are shown such that one of ordinary skill in the art may easily work the disclosure. The disclosure may be implemented in a form that can be implemented in the aerosol generating devices of the various embodiments described above or may be implemented in various different forms, and is not limited to the embodiments described herein.

Hereinafter, embodiments of the disclosure will be described in detail with reference to the drawings.

FIG. 1 is a block diagram illustrating components of an aerosol generating device according to an embodiment.

Referring to FIG. 1, an aerosol generating device 100 according to an embodiment may include a sensor 200, a battery 300, a processor 400, and a heater 500. Components of the aerosol generating device 100 according to an embodiment are not limited to the above-described embodiment, and at least one component may be added or at least one component may be omitted depending on an embodiment.

The sensor 200 may detect the aerosol generating device 100 and/or information about the aerosol generating device 100 for the operation of the aerosol generating device 100.

According to an embodiment, for example, the sensor 200 may include a capacitance sensor for detecting a change in capacitance. For example, the sensor 200 may detect a change in capacitance of an accommodation space into which an aerosol generating article is inserted, and generate a sensing signal corresponding to the change in capacitance of the accommodation space. In this regard, the sensing signal generated by the sensor 200 may be transmitted to the processor 400, and the processor 400 may control the operation of the aerosol generating device 100 based on the sensing signal accommodated from the sensor 200.

In the disclosure, the 'change in capacitance of the accommodation space' may mean a change in capacitance between the sensor 200 and the accommodation space. In addition, in the disclosure, the 'aerosol generating article (or cigarette)' includes at least one of an aerosol generating material and a tobacco material, and may refer to a configuration that creates or generates an aerosol by heating.

In addition, in the disclosure, the 'sensing signal' may mean a signal including at least one of a voltage change signal, a frequency change signal, a charge time change signal, or a discharge time change signal corresponding to the change in the capacitance of the accommodation space into which the aerosol generating article is inserted. Corresponding expressions may be used with the same meaning hereinafter, and redundant descriptions thereof are omitted below.

The battery 300 may serve to supply power required for the operation of the aerosol generating device 100. In an example, the battery 300 may be electrically connected to the sensor 200 and the processor 400 to supply power required for the operations of the sensor 200 and the processor 400. In another example, the battery 300 may be electrically connected to the heater 500 to supply power for heating the heater 500 to a predetermined temperature.

The processor 400 may be electrically or operatively connected to the components of the aerosol generating device 100 to control the overall operation of the aerosol generating device 100.

According to an embodiment, the processor 400 may be electrically or operatively connected to the sensor 200, the battery 300 and/or the heater 500 to receive the sensing signal from the sensor 200, and control power supplied from the battery 300 to the heater 500 based on the received sensing signal. For example, the processor 400 may detect whether an aerosol is inserted, a user's puff operation, and whether the aerosol generating article is removed based on the sensing signal generated from the sensor 200, and control power supplied to the heater 500 based on a detection result. However, a detailed description thereof will be provided below.

The heater 500 may heat at least a part of the aerosol generating article inserted into the accommodation space. For example, the heater 500 may heat at least a part of the aerosol generating article as power is supplied from the battery 300, and accordingly, a phase of the aerosol generating material included in the aerosol generating article is transformed so that the aerosol may be generated.

In an embodiment, the heater 500 is not limited to an induction heating type heater that heats the aerosol generating article through an alternating magnetic field. In another embodiment, the heater 500 may be at least one of an internal heating type heater that is inserted into the inside of the aerosol generating article to heat the aerosol generating article, and an external heating type heater that is disposed to surround at least a part of the aerosol generating article to heat the aerosol generating article, but is not limited thereto.

FIG. 2 is a block diagram illustrating components of a sensor according to an embodiment.

At this time, FIG. 2 may be an embodiment of the sensor 200 of the aerosol generating device 100 of FIG. 1, and a redundant description thereof is omitted below.

Referring to FIG. 2, the sensor 200 according to an embodiment may include an electrode 210, a printed circuit board 220, and a ground 230.

The electrode 210 may detect a change in capacitance of an accommodation space into which an aerosol generating article is inserted, and generate a sensing signal corresponding to the change in capacitance of the accommodation space. For example, the electrode 210 may be formed of a metal thin film (e.g., copper foil) to detect the change in capacitance of the accommodation space, but is not limited thereto.

The electrode 210 may be disposed in a region adjacent to the accommodation space to sense the change in capacitance of the accommodation space. For example, the electrode 210 may be disposed to surround at least a part of an outer circumferential surface of the accommodation space, but an arrangement structure of the electrode 210 is not limited thereto.

According to an embodiment, the electrode 210 may detect the change in capacitance of the accommodation space due to the insertion of the aerosol generating article, and generate a sensing signal corresponding to the change in capacitance of the accommodation space. For example, when the aerosol generating article is inserted into the accommodation space, an amount of electric charges of the electrode 210 may be reduced by the aerosol generating article, and thus the capacitance of the accommodation space. Accordingly, the electrode 210 may generate the sensing signal corresponding to an amount of decrease in capacitance of the accommodation space according to the insertion of the aerosol generating article.

According to another embodiment, the electrode 210 may detect a change in capacitance of the accommodation space due to a user's puff operation, and generate a sensing signal corresponding to the change in capacitance of the accommodation space.

For example, as the aerosol generating article is heated by a heater (e.g., the heater 500 of FIG. 1), an aerosol including moisture may be generated. At this time, the amount of electric charges of the electrode 210 may decrease due to the generation of the aerosol, and thus the electrode 210 may generate the sensing signal corresponding to the amount of decrease in capacitance of the accommodation space according to the generation of the aerosol.

As another example, when the generated aerosol generating article is discharged from the accommodation space due to the user's puff operation, the amount of electric charges of the electrode 210 may increase due to the discharge of the aerosol, and thus the capacitance of the accommodation space may increase. In this regard, the electrode 210 may generate a sensing signal corresponding to an amount of increase in the capacitance of the accommodation space according to the discharge of the aerosol.

According to another embodiment, the electrode 210 may detect a change in the capacitance of the accommodation space due to the removal of the aerosol generating article, and generate a sensing signal corresponding to the change in the capacitance of the accommodation space. For example, when the aerosol generating article is removed from the accommodation space, the amount of electric charges of the electrode 210 may increase so that the capacitance of the accommodation space may increase. In this regard, the electrode 210 may generate a sensing signal corresponding to an amount of increase in the capacitance of the accommodation space due to the removal of the aerosol generating article.

The sensing signal generated by the electrode 210 may be transmitted to a processor electrically or operatively connected to the sensor 200, and the processor may detect whether the aerosol generating article is inserted, whether the aerosol generating article is removed, and the user's puff operation through the generated sensing signal. Also, the processor may control an amount of power supplied to the heater based on the above-described detection result, and a detailed description thereof will be provided below.

The printed circuit board 220 may include a first surface on which the electrode 210 is disposed (or 'mounted') and a second surface positioned in a direction opposite to the first surface and on which the ground 230 is disposed. According to an embodiment, the printed circuit board 220 may include a flexible printed circuit board (FPCB), and may be disposed to surround at least a part of an outer circumferential surface of the accommodation space.

The electrode 210 disposed on the first surface of the printed circuit board 220 through the above-described arrangement structure of the printed circuit board 220 may surround at least a part of the outer circumferential surface of the aerosol generating article when the aerosol generating article is inserted, and a detailed description thereof is provided below.

The ground 230 may be electrically connected to the electrode 210 to shield noise introduced into the electrode 210. For example, noise may be generated inside and/or outside the aerosol generating device during the operation of the aerosol generating device, and the generated noise may be introduced into the electrode 210 to increase the precision of the sensing signal generated from the electrode 210.

According to an embodiment, the electrode 210 may be grounded to the ground 230 through an electrical connection relationship between the electrode 210 and the ground 230, and as a result, the ground 230 may serve to shield noise introduced into the electrode 210. For example, the electrode 210 and the ground 230 may be electrically connected through an electrical connection means (e.g., a signal wiring and a conductive via), but is not limited thereto.

FIG. 3 is a perspective view illustrating a partial region of an aerosol generating device according to an embodiment.

Referring to FIG. 3, the aerosol generating device 100 according to an embodiment may include the housing 110 into which the aerosol generating article 10 may be inserted and the sensor 200. At least one of the components of the aerosol generating device 100 according to an embodiment may be the same as or similar to at least one of the components of the aerosol generating device 100 of FIG. 1, and a redundant description thereof is omitted below.

The housing 110 may include an accommodation space 110i into which the aerosol generating article 10 may be inserted, and may form the overall appearance of the aerosol generating device 100. At least a part of the aerosol generating article 10 may be inserted into or accommodated inside the housing 110 through the accommodation space 110i.

The aerosol generating article 10 inserted into the accommodation space 110i may be heated by a heater (e.g., the heater 500 of FIG. 1) inside the housing 110, and vaporized particles generated by heating of the aerosol generating article 10 and air introduced into the housing 110 through the accommodation space 110i may be mixed so that an aerosol may be generated.

The generated aerosol may pass through the aerosol generating article 10 inserted in the accommodation space 110i or may be discharged to the outside of the aerosol generating device 100 through an empty space between the aerosol generating article 10 and the accommodation space 110i, and a user may inhale the aerosol discharged through a puff operation.

In the drawings, only the embodiment in which the housing 110 is formed in a columnar shape having an elliptical cross-section is illustrated, but the shape of the housing 110 is not limited to the illustrated embodiment. According to an embodiment (not shown), the housing 110 may be formed in a polygonal column (e.g., a triangular column and a quadrangular column) or a cylindrical shape.

According to an embodiment, the housing 110 may include an inner space in which the components of the aerosol generating device 100 may be disposed. For example, the sensor 200 for detecting a change in the capacitance of the accommodation space 110$i$, a heater for heating at least a part of the aerosol generating article 10 inserted into the accommodation space 110$i$, and a processor (e.g., the processor 400 of FIG. 1) for controlling the operation of the aerosol generating device 100 may be disposed in the inner space of the housing 110. However, the components disposed in the inner space of the housing 110 are not limited to the above-described embodiment.

The sensor 200 may be disposed adjacent to the accommodation space 110$i$ in the inner space of the housing 110 to detect a change in capacitance of the accommodation space 110$i$, and generate a sensing signal corresponding to the change in capacitance of the accommodation space 110$i$. At this time, the sensing signal may include at least one of a voltage change signal, a frequency change signal, and a charge/discharge time change signal of the sensor 200 corresponding to the change in capacitance of the accommodation space 110$i$, but a type of the sensing signal is not limited to the above-described embodiment.

For example, the capacitance of the accommodation space 110$i$ may change due to insertion of the aerosol generating article 10, removal of the aerosol generating article 10, and/or a user's puff operation. The sensor 200 may generate a sensing signal corresponding to the change in capacitance of the accommodation space 110$i$, and transmit the generated sensing signal to a processor (e.g., the processor 400 of FIG. 1).

The processor may detect whether the aerosol generating article 10 is inserted, whether the aerosol generating article 10 is removed, and/or whether the user's puff operation is performed based on the sensing signal generated by the sensor 200, and control power supplied to a heater based on a detection result. However, a detailed description thereof is provided below.

According to an embodiment, the sensor 200 may be disposed to surround at least a part of the outer circumferential surface of the accommodation space 110$i$ in the inner space of the housing 110. For example, the sensor 200 may be formed in a substantially "U" shape when viewed on a z-axis to surround at least a part of the outer circumferential surface of the accommodation space 110$i$, but the shape and/or arrangement structure of the sensor 200 is not limited to the above-described embodiment.

Hereinafter, the arrangement structure of the sensor 200 will be described in detail with reference to FIGS. 4A and 4B.

FIG. 4A is a cross-sectional view of the aerosol generating device of FIG. 3 taken in a direction A-A' according to an embodiment, and FIG. 4B is a cross-sectional view of the aerosol generating device of FIG. 3 taken in a direction B-B'.

Referring to FIGS. 4A and 4B, the aerosol generating device 100 according to an embodiment may include the housing 110, the sensor 200, the processor 400, and the heater 500. At least one of the components of the aerosol generating device 100 according to an embodiment may be the same as or similar to at least one of the components of the aerosol generating device 100 of FIGS. 1 and/or 3, and a redundant description thereof is omitted below.

The sensor 200 may be located in an inner space of the housing 110 to detect a change in capacitance of the accommodation space 110$i$ and generate a sensing signal corresponding to the change in capacitance of the accommodation space 110$i$.

In an embodiment, the sensor 200 may be disposed to be spaced apart from the accommodation space 110$i$ in the inner space of the housing 110. For example, the sensor 200 may be disposed to be spaced apart from the accommodation space 110$i$ by a predetermined distance d in a direction (e.g., x direction of FIG. 4A) across a longitudinal direction of the housing 110.

In the disclosure, the 'predetermined distance' may mean a distance at which the electrode 210 of the sensor 200 may detect a change in the capacitance of the accommodation space 110$i$, and the predetermined distance may be changed according to the size, shape, and usage environment of the aerosol generating device 100.

When the sensor 200 is disposed inside the accommodation space 110$i$, due to introduction of contact or external foreign substances (e.g., dust) generated between the sensor 200 and the aerosol generating article 10 inserted into the accommodation space 110$i$, noise may be included in the sensing signal generated by the sensor 200.

The aerosol generating device 100 according to an embodiment may reduce noise generated due to the introduction of contact or external foreign substances of the sensor 200 disposed inside the housing 110 and the aerosol generating article 10 through the sensor 200.

According to an embodiment, the sensor 200 may include the electrode 210, the printed circuit board 220, and the ground 230. At least one of the components of the sensor 200 may be the same as or similar to at least one of the components of the sensor 200 of FIG. 2, and a redundant description thereof is omitted below.

The printed circuit board 220 may include a FPCB, and the sensor 200 may be disposed to surround at least a part of the outer circumferential surface of the accommodation space 110$i$ in the inner space of the housing 110 through the printed circuit board 220 described above.

According to an embodiment, the printed circuit board 220 may be fixed or supported in the inner space of the housing 110 through a fixing member 120. For example, the fixing member 120 may be located in the inner space of the housing 110 to fix or support the printed circuit board 220, and accordingly, the printed circuit board 220 may maintain the arrangement structure surrounding at least a part of the outer circumferential surface of the accommodation space 110$i$. For example, the printed circuit board 220 may be arranged in a substantially "U" shape when viewed on a xy plane or the z axis to surround at least a part of the outer circumferential surface of the accommodation space 110$i$, and the arrangement structure of the "U" shape of the printed circuit board 220 may be maintained by the fixing member 120.

According to an embodiment, the printed circuit board 220 may include a first surface 220$a$ facing the accommodation space 110$i$ and a second surface 220$b$ located in the opposite direction to the first surface 220$a$ and facing the outer circumferential surface of the housing 110. At this time, the electrode 210 may be disposed on the first surface 220$a$ facing the accommodation space 110$i$ of the printed circuit board 220, and the ground 230 may be disposed on the second surface 220$b$ located in the opposite direction to the first surface 220$a$.

When the ground 230 is disposed on the first surface 220$a$ of the printed circuit board 220 and the electrode 210 is disposed on the second surface 220$b$ of the printed circuit board 220, since the ground 230, which is a conductor, is located between the electrode 210 and the accommodation space 110i, the ground 230 may influence a change in an amount of charges of the electrode 210. Accordingly, in the above-described arrangement structure, a situation in which the sensor 200 cannot precisely detect a change in capacitance of the accommodation space 110i may occur.

On the other hand, in the aerosol generating device 100 according to an embodiment, the electrode 210 is disposed on the first surface 220a of the printed circuit board 220, and the ground 230 is disposed on the second surface 220b of the printed circuit board 220, and thus, the influence of the ground 230 on the change in the amount of charges of the electrode 210 may be reduced, and as a result, the measurement precision of the sensor 200 may be maintained.

According to an embodiment, as the printed circuit board 220 is disposed to surround at least a part of the outer circumferential surface of the accommodation space 110i, the electrode 210 disposed on the first surface 220a of the printed circuit board 220 may also surround at least a part of the outer circumferential surface of the accommodation space 110i. In addition, the electrode 210 may surround at least a part of the outer circumferential surface of the aerosol generating article 10 inserted into the accommodation space 110i when the aerosol generating article 10 is inserted through the above-described arrangement structure. For example, the electrode 210 may be disposed to surround half of a circumference of the outer circumferential surface of the aerosol generating article 10 inserted into the accommodation space 110i as shown in FIG. 4B, but the arrangement structure of the electrode 210 is not limited thereto.

In an embodiment, the electrode 210 may include a first electrode 211 and a second electrode 212 for detecting the change in capacitance of the accommodation space 110i. For example, the first electrode 211 may be disposed to be spaced apart from the second electrode 212 in the longitudinal direction (e.g., z-direction) of the housing 110, and each of the first electrode 211 and the second electrode 212 may generate a sensing signal corresponding to the change in capacitance of the accommodation space 110i.

According to an embodiment, the first electrode 211 may generate a first sensing signal corresponding to the change in capacitance of the accommodation space 110i, and the second electrode 212 may generate a second sensing signal corresponding to the change in capacitance of the accommodation space 110i. The first sensing signal and the second sensing signal respectively generated from the first electrode 211 and the second electrode 212 may be transmitted to the processor 400.

In the drawings, only an embodiment in which the sensor 200 includes the first electrode 211 and the second electrode 212 is illustrated, but the number of electrodes 210 is not limited to the illustrated embodiment. According to an embodiment (not shown), the sensor 200 may include one electrode or three or more electrodes.

The ground 230 may be located on the second surface 220b of the printed circuit board 220 in a direction opposite to the electrode 210, and may serve to shield noise introduced into the electrode 210. For example, the electrode 210 may be electrically connected to the ground 230 to be grounded, and the ground 230 may shield noise introduced into the electrode 210 from the inside and/or outside of the aerosol generating device 100 through the above-described electrical connection relationship. For example, the electrode 210 and the ground 230 may be electrically connected to each other through an electrical connection means (e.g., a signal wiring and a conductive via), but is not limited thereto.

During an operation of the aerosol generating device 100, external noise due to a user's movement (e.g., a movement of hands) may be introduced into the electrode 210, or internal noise generated during an operation process of the components (e.g., the processor 400) of the aerosol generating device 100 may be introduced into the electrode 210, which may cause a situation in which the precision of the sensing signal is reduced to occur.

The aerosol generating device 100 according to an embodiment may shield external noise and/or internal noise introduced into the electrode 210 through the ground 230 electrically connected to the electrode 210, and as a result, the measurement precision of the sensor 200 may be improved.

According to an embodiment, the ground 230 may include a mesh-type ground, and a detailed description of the shape of the ground 230 is described below.

The processor 400 may be electrically or operatively connected to the electrode 210 of the sensor 200, and may obtain a sensing signal corresponding to a change in capacitance of the accommodation space 110i through the electrode 210. For example, the processor 400 may obtain a first sensing signal through the first electrode 211 and obtain a second sensing signal through the second electrode 212.

According to an embodiment, the processor 400 may detect whether the aerosol generating article 10 is inserted based on the sensing signal obtained through the electrode 210, and when the insertion of the aerosol generating article 10 is detected, may supply power to the heater 500 through a battery (e.g., the battery 300 of FIG. 1) to preheat the heater 500.

According to another embodiment, the processor 400 may detect a user's puff operation based on the sensing signal obtained through the electrode 210, and supply power to the heater 500 through the battery when the user's puff operation is detected to heat the aerosol generating article 10 inserted into the accommodation space 110i.

According to another embodiment, the processor 400 may detect whether the aerosol generating article 10 is removed based on the sensing signal obtained through the electrode 210, and when the removal of the aerosol generating article 10 is detected, may clean foreign substances in the accommodation space 110i by supplying power to the heater 500 through the battery.

The heater 500 may generate an aerosol by heating at least a part of the aerosol generating article 10 inserted into the accommodation space 110i.

According to an embodiment, the heater 500 may include an induction heating type heater. For example, the heater 500 may include a coil 510 (or an 'electrically conductive coil') that generates an alternating magnetic field as power is supplied, and a susceptor 520 that generates heat by the alternating magnetic field generated by the coil 510.

For example, the susceptor 520 may be disposed to be inserted into the inside of the aerosol generating article 10 upon insertion of the aerosol generating article 10 to heat the aerosol generating article 10 inserted into the accommodation space 110i. As another example, the susceptor 520 may be disposed to surround the outer circumferential surface of the accommodation space 110i to heat the inserted aerosol generating article 10.

At this time, the sensor 200 may be located between the accommodation space 110i and the coil 510 to reduce noise due to the magnetic field generated by the coil 510, but an arrangement position of the sensor 200 is limited thereto.

In FIG. 4A, only an embodiment in which the heater 500 is an induction heating type heater is illustrated, but the heater 500 is not limited to the illustrated embodiment.

According to another embodiment, the heater 500 may include an electrically resistive heater. For example, the heater 500 may include a film heater disposed to surround at least a part of the outer circumferential surface of the aerosol generating article 10 inserted into the accommodation space 110i. The film heater may include an electrically conductive track, and when an electric current flows through the electrically conductive track, the film heater may generate heat to heat the inserted aerosol generating article 10.

According to another embodiment, the heater 500 may include at least one of a needle-type heater, a rod-type heater, and a tubular heater capable of heating the inside of the aerosol generating article 10 inserted into the accommodation space 110i. The heater described above may be inserted into the inside of the aerosol generating article 10, for example, to heat the inside of the aerosol generating article 10.

Hereinafter, a structure of the sensor 200 will be described in detail with reference to FIGS. 5 and 6.

FIG. 5 is a diagram illustrating a first surface of a printed circuit board of a sensor in an unfolded state of the printed circuit board according to an embodiment, and FIG. 6 is a diagram illustrating a second surface of the printed circuit board of the sensor in the unfolded state of the printed circuit board according to an embodiment Also, FIG. 7A is a graph illustrating a change in a sensing signal generated by the sensor according to an embodiment, and FIG. 7B is a graph illustrating a change in a sensing signal generated by the sensor according to another embodiment.

At this time, FIG. 7A shows the change of the sensing signal according to the insertion of the aerosol generating article under the condition that the area of the ground 230 is less than 5% of the area of the second surface 220b of the printed circuit board 220. In addition, FIG. 7B shows a change in a sensing signal according to the insertion of an aerosol generating article under the condition that the area of the ground 230 exceeds 50% of the area of the second surface 220b of the printed circuit board 220.

Referring to FIGS. 5 and 6, the sensor 200 according to an embodiment may include the electrode 210, the printed circuit board 220, and the ground 230. The sensor 200 according to an embodiment may be an embodiment of the sensor 200 of the aerosol generating device 100 of FIGS. 4A and/or 4B, and a redundant description thereof is omitted below.

The electrode 210 may be disposed or mounted on the first surface 220a of the printed circuit board 220. The first surface 220a of the printed circuit board 220 may be arranged to face an accommodation space (e.g., the accommodation space 110i of FIG. 4A) into which an aerosol generating article is inserted in an inner space of a housing (e.g., the housing 110 of FIG. 4A).

According to an embodiment, the electrode 210 may include a first electrode 211 and a second electrode 212 spaced apart from the first electrode 211. When the printed circuit board 220 is disposed to surround the accommodation space in the inner space of the housing, the first electrode 211 and the second electrode 212 may sense or detect a change in capacitance of the accommodation space, and generate a sensing signal corresponding to the change in capacitance.

In the drawings, only the embodiment in which the first electrode 211 and the second electrode 212 are formed in a metal thin film in a rectangular shape is illustrated, but the shapes of the first electrode 211 and the second electrode 212 are not limited to the illustrated embodiment. According to an embodiment, the first electrode 211 and/or the second electrode 212 may be formed in at least one of a trapezoidal shape, a polygonal shape, or an elliptical shape.

The ground 230 may be disposed or mounted on the second surface 220b of the printed circuit board 220. The ground 230 may be electrically connected to the electrode 210 disposed on the first surface 220a of the printed circuit board 220, and may serve to shield noise introduced into the electrode 210. For example, the electrode 210 and the ground 230 may be electrically connected to each other through an electrical connection means (not shown), and thus an electrical circuit may be formed between the electrode 210 and the ground 230.

According to an embodiment, the size of area of the ground 230 may be about 5% to 50% of the size of area of the second surface 220b of the printed circuit board 220. For example, the size of the area of the ground 230 may be about 25% of the size of the area of the second surface 220b of the printed circuit board 220, but is not limited thereto.

Referring to FIG. 7A, when the size of the area of the ground 230 is less than 5% of the size of the area of the second surface 220b of the printed circuit board 220, since the area of the ground 230 is small compared to the area of the second surface 220b, the noise shielding effect of the ground 230 may be insignificant. Accordingly, when the size of the area of the ground 230 is less than 5% of the size of the area of the second surface 220b of the printed circuit board 220, noise N may be included in the sensing signal generated from the electrode 210.

On the other hand, when the size of the area of the ground 230 exceeds 50% of the size of the area of the second surface 220b of the printed circuit board 220, since the corresponding area between the electrode 210 and the ground 230 is large, a short may occur in an electrical circuit formed between the electrode 210 and the ground 230.

For example, as the printed circuit board 220 is formed to have a thin thickness, the electrode 210 disposed on the first surface 220a may be adjacent to the ground 230 disposed on the second surface 220b. When an overlapping area between the electrode 210 and the ground 230 increases in a state where the electrode 210 and the ground 230 are adjacent to each other, an electrical effect similar to that the electrode 210 and the ground 230 are connected to each other occurs, and thus, a short may occur in the electrical circuit between the electrode 210 and the ground 230.

Referring to FIG. 7B, when a short occurs in the electrical circuit between the electrode 210 and the ground 230, no sensing signal may be generated by the electrode 210 even though the capacitance of the accommodation space changes due to the insertion of an aerosol generating article.

That is, in the aerosol generating device according to an embodiment, as the size of the area of the ground 230 is formed to be about 5% to 50% of the size of the area of the second surface 200b of the printed circuit board 220, noise introduced into the electrode 210 may be effectively shielded while preventing a short between the electrode 210 and the ground 230.

According to an embodiment, the ground 230 may include a mesh-type ground. The aerosol generating device may minimize the corresponding area between the electrode 210 and the ground 230 through the mesh-type ground, and as a result, a short in the electrical circuit between the electrode 210 and the ground 230 may be prevented from occurring. For example, the ground 230 may include grid-shaped grounds disposed at a predetermined distance, but is not limited thereto.

FIG. 8A is a cross-sectional view of the aerosol generating device of FIG. 3 cut in the direction A-A' according to another embodiment, and FIG. 8B is an enlarged view illustrating an enlarged cross-section of a sensor of the aerosol generating device of FIG. 8A.

Referring to FIGS. 8A and 8B, the aerosol generating device 100 according to another embodiment may include the housing 110, the sensor 200, the processor 400, and the heater 500. The aerosol generating device 100 according to another embodiment may be an aerosol generating device to which a first conductive via 240 and/or a second conductive via 250 are added to the aerosol generating device 100 of FIGS. 4A and/or 4B, and a redundant description thereof is omitted below.

According to an embodiment, the sensor 200 may include the electrode 210, the printed circuit board 220, the ground 230, and the first conductive via 240.

The first conductive via 240 may serve to shield noise (e.g., external noise) introduced into the electrode 210 of the sensor 200. For example, the printed circuit board 220 may include a first via hole $h_1$ penetrating between the first surface 220a and the second surface 220b, and the first conductive via 240 may be disposed in the first via hole $h_1$ to shield noise introduced into the electrode 210.

The first via hole $h_1$ and the first conductive via 240 may be disposed in a region of the printed circuit board 220 adjacent to an inlet of the accommodation space 110i. For example, the first via hole $h_1$ and the first conductive via 240 may be disposed in an upper region (e.g., a region in a z-direction) of the printed circuit board 220.

In an embodiment, the first conductive via 240 may extend in a direction from the second surface 220b of the printed circuit board 220 toward the first surface 220a. In this regard, at least a part of the first conductive via 240 may protrude from the first surface 220a in a direction toward the accommodation space 110i. For example, one end of the first conductive via 240 may be in contact with the ground 230 disposed on the second surface 220b and may be electrically connected to the ground 230. As another example, the other end of the first conductive via 240 may protrude from the first surface 220a in the direction toward the accommodation space 110i. Accordingly, when the aerosol generating device 100 is viewed on the z-axis, the electrode 210 may be covered by the first conductive via 240.

The first conductive via 240 is located in an upper region of the printed circuit board 220, and is formed to have at least a part protruding from the first surface 220a in the direction toward the accommodation space 110i, thereby shielding external noise introduced into the electrode 210 through the accommodation space 110i. For example, external noise may be generated by a movement of a user's body (e.g., a movement of a user's hand) generated during the operation of the aerosol generating device 100, and the first conductive via 240 may shield the external noise from being introduced into the electrode 210.

In the disclosure, the 'external noise' means noise generated from the outside of the aerosol generating device 100, and the external noise may be generated by a movement of a user's body or introduction of foreign substances.

According to another embodiment, the sensor 200 may further include a second conductive via 250 spaced apart from the first conductive via 240.

The second conductive via 250 may serve to shield noise (e.g., internal noise) introduced into the electrode 210 of the sensor 200. For example, the printed circuit board 220 may include a second via hole $h_1$ penetrating between the first surface 220a and the second surface 220b, and the second conductive via 250 may be disposed in the second via hole $h_2$ to shield noise introduced into the electrode 210.

The second via hole $h_2$ and the second conductive via 250 may be disposed on one region of the printed circuit board 220 spaced apart from the first via hole h or the first conductive via 240 in the longitudinal direction (e.g., −z direction) of the housing 110. For example, the second via hole $h_2$ and the second conductive via 250 may be disposed in a lower region (e.g., a region in the −z direction) of the printed circuit board 220.

In an embodiment, the second conductive via 250 may extend in a direction from the second surface 220b of the printed circuit board 220 toward the first surface 220a. In this case, at least a part of the second conductive via 250 may protrude from the first surface 220a in a direction toward the accommodation space 110i. For example, one end of the second conductive via 250 may be in contact with the ground 230 disposed on the second surface 220b and may be electrically connected to the ground 230. As another example, the other end of the second conductive via 250 may protrude from the first surface 220a in the direction toward the accommodation space 110i. Accordingly, when the aerosol generating device 100 is viewed on the z-axis, the electrode 210 may be covered by the second conductive via 250.

The second conductive via 250 is located in the lower region of the printed circuit board 220, and is formed to have at least a part protruding from the first surface 220a in the direction toward the accommodation space 110i, thereby shielding external noise introduced into the electrode 210 from the inside of the aerosol generating device 100. For example, the second conductive via 250 may be disposed adjacent to the processor 400 and/or a battery (e.g., the battery 300 of FIG. 1) disposed inside the housing 110, thereby shielding internal noise generated during the operation of the processor 400 and/or the battery from being introduced into the electrode 210.

In the disclosure, the 'internal noise' may mean noise generated during the operation of the components of the aerosol generating device 100, and the corresponding expression may be used in the same meaning below.

The aerosol generating device 100 according to another embodiment may shield noise generated from inside and/or outside the aerosol generating device 100 from being introduced into the electrode 210 through the ground 230, the first conductive via 240, and the second conductive via 250 described above. Accordingly, the measurement precision of the sensor 200 is improved, so that the aerosol generating device 100 may more precisely detect whether the aerosol generating article 10 is inserted and removed and/or whether the user performs a puff operation.

According to an embodiment, the first conductive via 240 and/or the second conductive via 250 may be formed by plating the first via hole $h_1$ and/or the second via hole $h_2$ and then filling a dielectric material (e.g., photo imageable solder resist mask ink (PSR), but is not limited thereto. In another embodiment, the first conductive via 240 and/or the second conductive via 250 may be formed by filling a conductive material in the first via hole $h_1$ and/or the second via hole $h_2$ without plating.

FIG. 9 is a flowchart illustrating a method, performed by an aerosol generating device, of detecting insertion of an aerosol generating article according to an embodiment, and FIG. 10 is a graph illustrating a change in a sensing signal obtained from a sensor of the aerosol generating device over time according to an embodiment.

Hereinafter, the method of detecting insertion of the aerosol generating article of FIG. 9 is described with reference to the graph shown in FIG. 10.

Referring to FIGS. 9 and 10, in operation 901, a processor (e.g., the processor 400 of FIG. 1) of the aerosol generating device (e.g., the aerosol generating device 100 of FIG. 1) according to an embodiment may obtain a sensing signal 1010 corresponding to a change in capacitance of an accommodation space (e.g., the accommodation space 110$i$ of FIG. 3) from a sensor (e.g., the sensor 200 of FIGS. 1 and 2).

In this regard, the sensing signal 1010 may include at least one of a voltage change signal, a frequency change signal, or a charge/discharge time change signal corresponding to the change in the capacitance of the accommodation space, but is not limited thereto.

In operation 902, the processor may determine or detect whether the magnitude of the sensing signal 1010 obtained in operation 901 of the aerosol generating device according to an embodiment is equal to or greater than a first threshold value. For example, the processor may compare the sensing signal 1010 with first threshold data stored in a memory, but is not limited thereto.

In the disclosure, the 'first threshold value' may mean a threshold value of the magnitude of the sensing signal for detecting whether the aerosol generating article is inserted, and when the aerosol generating article is inserted, the magnitude of the sensing signal 1010 may be equal to or greater than the first threshold value.

In operation 903, the processor of the aerosol generating device according to an embodiment may detect the insertion of the aerosol generating article when it is determined or detected that the magnitude of the sensing signal 1010 is equal to or greater than the first threshold value in operation 902. For example, when the magnitude of the sensing signal 1010 is equal to or greater than the first threshold value, the processor may determine that the aerosol generating article has been inserted into the accommodation space.

On the other hand, when the magnitude of the sensing signal 1010 is smaller than the first threshold value in operation 902, the processor of the aerosol generating device according to an embodiment may determine that the aerosol generating article is not inserted, and perform operations 901 to 902 again.

In operation 904, when the insertion of the aerosol generating article is detected, the processor of the aerosol generating device according to an embodiment may preheat a heater by supplying first power to the heater through a battery (e.g., the battery 300 of FIG. 1).

In the disclosure, the 'first power' may mean an amount of power supplied to the heater to preheat the heater to a predetermined temperature, and when the first power is supplied to the heater, the heater may be heated to the predetermined temperature.

Although not shown in the drawings, the processor of the aerosol generating device according to an embodiment may detect whether the aerosol generating article is removed based on the sensing signal obtained from the sensor after the insertion of the aerosol generating article is detected. For example, the processor may compare the sensing signal obtained from the sensor with a threshold value to determine whether the aerosol generating article has been removed from the accommodation space, and when the aerosol generating article is removed, supply power to the heater and remove foreign substances remaining in the accommodation space.

FIG. 11 is a flowchart illustrating a method, performed by an aerosol generating device, of detecting a puff operation of a user according to another embodiment, and FIG. 12 is a graph illustrating a change in a sensing signal obtained from a sensor of the aerosol generating device over time according to another embodiment.

Hereinafter, the method of detecting the puff operation of the user of FIG. 11 is described with reference to the graph shown in FIG. 12.

Referring to FIGS. 11 and 12, in operation 1101, a processor (e.g., the processor 400 of FIG. 1) of the aerosol generating device (e.g., the aerosol generating device 100 of FIG. 1) according to an embodiment may obtain a sensing signal 1210 corresponding to a change in capacitance of an accommodation space (e.g., the accommodation space 110$i$ of FIG. 3) from a sensor (e.g., the sensor 200 of FIGS. 1 and 2) Operation 1101 may be substantially the same as or similar to operation 901 of FIG. 9, and thus a redundant description thereof is omitted.

In operation 1102, the processor of the aerosol generating device according to an embodiment may determine or detect whether the magnitude of the sensing signal 1210 obtained in operation 1101 is equal to or greater than a second threshold value. For example, the processor may compare the sensing signal 1210 with second threshold data stored in a memory, but is not limited thereto.

In the disclosure, the 'second threshold value' may mean a threshold value of the magnitude of a sensing signal for detecting the puff operation of the user, and the magnitude of the sensing signal 1210 when the puff operation of the user is performed may be equal to or greater than the second threshold value.

In operation 1103, the processor of the aerosol generating device according to an embodiment may detect the puff operation of the user when it is determined or detected that the magnitude of the sensing signal 1210 is equal to or greater than the second threshold value in operation 1102. For example, when the magnitude of the sensing signal 1210 is equal to or greater than the second threshold value, the processor may determine that the puff operation of the user has been performed.

On the other hand, when the magnitude of the sensing signal 1210 is smaller than the second threshold value in operation 1102, the processor of the aerosol generating device according to an embodiment may determine that the puff operation of the user has not been performed, and perform operations 1101 to 1102 again.

In operation 1104, when the puff operation of the user is detected, the processor of the aerosol generating device according to an embodiment may supply second power to the heater through a battery (e.g., the battery 300 of FIG. 1) and heat the heater so that the temperature of the heater corresponds to a specified temperature profile, and as a result, an aerosol may be generated from the aerosol generating article.

In the disclosure, the 'second power' may mean an amount of power for controlling the temperature of the heater to correspond to the specified temperature profile, and when the second power is supplied to the heater, the aerosol generating article may be heated to generate the aerosol.

FIG. 13 is a block diagram of an aerosol generating device 1300 according to another embodiment.

The aerosol generating device 1300 may include a processor 1310, a sensing unit 1320, an output unit 1330, a battery 1340, a heater 1350, a user input unit 1360, a memory 1370, and a communication unit 1380. However, the internal structure of the aerosol generating device 1300 is not limited to those illustrated in FIG. 13. That is, according to the design of the aerosol generating device 1300, it will be understood by one of ordinary skill in the art that some of the components shown in FIG. 13 may be omitted or new components may be added.

The sensing unit 1320 may sense a state of the aerosol generating device 1300 and a state around the aerosol generating device 1300, and transmit sensed information to the processor 1310. Based on the sensed information, the processor 1310 may control the aerosol generating device 1300 to perform various functions, such as controlling an operation of the heater 1350, limiting smoking, determining whether an aerosol generating article (e.g., a cigarette, a cartridge, or the like) is inserted, displaying a notification, or the like.

The sensing unit 1320 may include at least one of a temperature sensor 1322, an insertion detection sensor, and a puff sensor 1326, but is not limited thereto.

The temperature sensor 1322 may sense a temperature at which the heater 1350 (or an aerosol generating material) is heated. The aerosol generating device 1300 may include a separate temperature sensor for sensing the temperature of the heater 1350, or the heater 1350 may serve as a temperature sensor. Alternatively, the temperature sensor 1322 may also be arranged around the battery 1340 to monitor the temperature of the battery 1340.

The insertion detection sensor 1324 may sense insertion and/or removal of an aerosol generating article. For example, the insertion detection sensor 1324 may include at least one of a film sensor, a pressure sensor, an optical sensor, a resistive sensor, a capacitive sensor, an inductive sensor, and an infrared sensor, and may sense a signal change according to the insertion and/or removal of an aerosol generating article.

The puff sensor 1326 may sense a user's puff on the basis of various physical changes in an airflow passage or an airflow channel. For example, the puff sensor 1326 may sense a user's puff on the basis of any one of a temperature change, a flow change, a voltage change, and a pressure change.

The sensing unit 1320 may include, in addition to the temperature sensor 1322, the insertion detection sensor 1324, and the puff sensor 1326 described above, at least one of a temperature/humidity sensor, a barometric pressure sensor, a magnetic sensor, an acceleration sensor, a gyroscope sensor, a location sensor (e.g., a global positioning system (GPS)), a proximity sensor, and a red-green-blue (RGB) sensor (illuminance sensor). Because a function of each of sensors may be intuitively inferred by one of ordinary skill in the art from the name of the sensor, a detailed description thereof may be omitted.

The output unit 1330 may output information on a state of the aerosol generating device 1300 and provide the information to a user. The output unit 1330 may include at least one of a display unit 1332, a haptic unit 1334, and a sound output unit 1336, but is not limited thereto. When the display unit 1332 and a touch pad form a layered structure to form a touch screen, the display unit 1332 may also be used as an input device in addition to an output device.

The display unit 1332 may visually provide information about the aerosol generating device 1300 to the user. For example, information about the aerosol generating device 1300 may mean various pieces of information, such as a charging/discharging state of the battery 1340 of the aerosol generating device 1300, a preheating state of the heater 1350, an insertion/removal state of an aerosol generating article, or a state in which the use of the aerosol generating device 1300 is restricted (e.g., sensing of an abnormal object), or the like, and the display unit 1332 may output the information to the outside. The display unit 1332 may be, for example, a liquid crystal display panel (LCD), an organic light-emitting diode (OLED) display panel, or the like. In addition, the display unit 1332 may be in the form of a light-emitting diode (LED) light-emitting device.

The haptic unit 1334 may tactilely provide information about the aerosol generating device 1300 to the user by converting an electrical signal into a mechanical stimulus or an electrical stimulus. For example, the haptic unit 1334 may include a motor, a piezoelectric element, or an electrical stimulation device.

The sound output unit 1336 may audibly provide information about the aerosol generating device 1300 to the user. For example, the sound output unit 1336 may convert an electrical signal into a sound signal and output the same to the outside.

The battery 1340 may supply power used to operate the aerosol generating device 1300. The battery 1340 may supply power such that the heater 1350 may be heated. In addition, the battery 1340 may supply power required for operations of other components (e.g., the sensing unit 1320, the output unit 1330, the user input unit 1360, the memory 1370, and the communication unit 1380) in the aerosol generating device 1300. The battery 1340 may be a rechargeable battery or a disposable battery. For example, the battery 1340 may be a lithium polymer (LiPoly) battery, but is not limited thereto.

The heater 1350 may receive power from the battery 1340 to heat an aerosol generating material. Although not illustrated in FIG. 13, the aerosol generating device 1300 may further include a power conversion circuit (e.g., a direct current (DC)/DC converter) that converts power of the battery 1340 and supplies the same to the heater 1350. In addition, when the aerosol generating device 1300 generates aerosols in an induction heating method, the aerosol generating device 1300 may further include a DC/alternating current (AC) that converts DC power of the battery 1340 into AC power.

The processor 1310, the sensing unit 1320, the output unit 1330, the user input unit 1360, the memory 1370, and the communication unit 1380 may each receive power from the battery 1340 to perform a function. Although not illustrated in FIG. 13, the aerosol generating device 1300 may further include a power conversion circuit that converts power of the battery 1340 to supply the power to respective components, for example, a low dropout (LDO) circuit, or a voltage regulator circuit.

In an embodiment, the heater 1350 may be formed of any suitable electrically resistive material. For example, the suitable electrically resistive material may be a metal or a metal alloy including titanium, zirconium, tantalum, platinum, nickel, cobalt, chromium, hafnium, niobium, molybdenum, tungsten, tin, gallium, manganese, iron, copper, stainless steel, nichrome, or the like, but is not limited thereto. In addition, the heater 1350 may be implemented by a metal wire, a metal plate on which an electrically conductive track is arranged, a ceramic heating element, or the like, but is not limited thereto.

In another embodiment, the heater 1350 may be a heater of an induction heating type. For example, the heater 1350 may include a susceptor that heats an aerosol generating material by generating heat through a magnetic field applied by a coil.

The user input unit 1360 may receive information input from the user or may output information to the user. For example, the user input unit 1360 may include a key pad, a dome switch, a touch pad (a contact capacitive method, a pressure resistance film method, an infrared sensing method, a surface ultrasonic conduction method, an integral tension measurement method, a piezo effect method, or the like), a jog wheel, a jog switch, or the like, but is not limited thereto. In addition, although not illustrated in FIG. 13, the aerosol generating device 1300 may further include a connection interface, such as a universal serial bus (USB) interface, and may connect to other external devices through the connection interface, such as the USB interface, to transmit and receive information, or to charge the battery 1340.

The memory 1370 is a hardware component that stores various types of data processed in the aerosol generating device 1300, and may store data processed and data to be processed by the processor 1310. The memory 1370 may include at least one type of storage medium from among a flash memory type, a hard disk type, a multimedia card micro type memory, a card-type memory (for example, secure digital (SD) or extreme digital (XD) memory, etc.), random access memory (RAM), static random access memory (SRAM), read-only memory (ROM), electrically erasable programmable read-only memory (EEPROM), programmable read-only memory (PROM), a magnetic memory, a magnetic disk, and an optical disk. The memory 1370 may store an operation time of the aerosol generating device 1300, the maximum number of puffs, the current number of puffs, at least one temperature profile, data on a user's smoking pattern, etc.

The communication unit 1380 may include at least one component for communication with another electronic device. For example, the communication unit 1380 may include a short-range wireless communication unit 1382 and a wireless communication unit 1384.

The short-range wireless communication unit 1382 may include a Bluetooth communication unit, a Bluetooth Low Energy (BLE) communication unit, a near field communication unit, a wireless LAN (WLAN) (Wi-Fi) communication unit, a Zigbee communication unit, an infrared data association (IrDA) communication unit, a Wi-Fi Direct (WFD) communication unit, an ultra-wideband (UWB) communication unit, an Ant+ communication unit, or the like, but is not limited thereto.

The wireless communication unit 1384 may include a cellular network communication unit, an Internet communication unit, a computer network (e.g., local area network (LAN) or wide area network (WAN)) communication unit, or the like, but is not limited thereto. The wireless communication unit 1384 may also identify and authenticate the aerosol generating device 1300 within a communication network by using subscriber information (e.g., International Mobile Subscriber Identifier (IMSI)).

The processor 1310 may control general operations of the aerosol generating device 1300. In an embodiment, the processor 1310 may include at least one processor. The processor may be implemented as an array of a plurality of logic gates or may be implemented as a combination of a general-purpose microprocessor and a memory in which a program executable by the microprocessor is stored. It will be understood by one of ordinary skill in the art that the processor may be implemented in other forms of hardware.

The processor 1310 may control the temperature of the heater 1350 by controlling supply of power of the battery 1340 to the heater 1350. For example, the processor 1310 may control power supply by controlling switching of a switching element between the battery 1340 and the heater 1350. In another example, a direct heating circuit may also control power supply to the heater 1350 according to a control command of the processor 1310.

The processor 1310 may analyze a result sensed by the sensing unit 1320 and control subsequent processes to be performed. For example, the processor 1310 may control power supplied to the heater 1350 to start or end an operation of the heater 1350 on the basis of a result sensed by the sensing unit 1320. As another example, the processor 1310 may control, based on a result sensed by the sensing unit 1320, an amount of power supplied to the heater 1350 and the time the power is supplied, such that the heater 1350 may be heated to a certain temperature or maintained at an appropriate temperature.

In an embodiment, the processor 1310 may obtain sensing signal corresponding to a change in capacitance from the sensing unit 1320, and control the power supplied to the heater 1350 based on the sensing signal.

For example, when the sensing signal from the sensing unit 1320 is equal to or greater than first threshold value, the processor 1310 may supply first power to the heater 1350 to perform preheat mode. The 'first power' may mean an amount of power supplied to the heater to preheat the heater to a predetermined temperature.

As another example, when the sensing signal from the sensing unit 1320 is equal to or greater than second threshold value in a state in which the puff operation of the user is detected, the processor 1310 may supply second power to the heater 1350 to perform heating mode. The 'second power' may mean an amount of power for controlling the temperature of the heater to correspond to the specified temperature profile.

As another example, when the sensing signal from the sensing unit 1320 is equal to or greater than third threshold value, the processor 1310 may supply third power to the heater 1350 to perform cleaning mode. The 'third power' may mean an amount of power for controlling the temperature of the heater to remove impurities attached to the heater 1350.

The processor 1310 may control the output unit 1330 on the basis of a result sensed by the sensing unit 1320. For example, when the number of puffs counted through the puff sensor 1326 reaches a preset number, the processor 1310 may notify the user that the aerosol generating device 1300 will soon be terminated through at least one of the display unit 1332, the haptic unit 1334, and the sound output unit 1336.

One embodiment may also be implemented in the form of a computer-readable recording medium including instructions executable by a computer, such as a program module executable by the computer. The computer-readable recording medium may be any available medium that may be accessed by a computer and includes both volatile and nonvolatile media, and removable and non-removable media. In addition, the computer-readable recording medium may include both a computer storage medium and a communication medium. The computer storage medium includes all of volatile and nonvolatile media, and removable and non-removable media implemented by any method or technology for storage of information such as computer-readable instructions, data structures, program modules, or other data. The communication medium typically includes computer-readable instructions, data structures, other data in modulated data signals such as program modules, or other transmission mechanisms, and includes any information transfer media.

The descriptions of the above-described embodiments are merely examples, and it will be understood by one of ordinary skill in the art that various changes and equivalents thereof may be made. Therefore, the scope of the disclosure should be defined by the appended claims, and all differences within the scope equivalent to those described in the claims will be construed as being included in the scope of protection defined by the claims.

The invention claimed is:

1. An aerosol generating device comprising:
   a housing comprising an accommodation space for receiving an aerosol generating article;
   a heater configured to heat the aerosol generating article inserted into the accommodation space to generate an aerosol;
   a sensor configured to generate a sensing signal corresponding to a change in capacitance of the accommodation space; and
   a processor electrically connected to the heater and the sensor,
   wherein the sensor comprises:
   a printed circuit board disposed to surround at least a part of an outer circumferential surface of the accommodation space;
   an electrode disposed on one region of the printed circuit board and configured to generate the sensing signal corresponding to the change in capacitance of the accommodation space; and
   ground disposed in another region of the printed circuit board located in a direction opposite to the one region, the electrode being electrically connected to the ground to shield noise.

2. The aerosol generating device of claim 1,
   wherein the printed circuit board comprises a first surface facing the outer circumferential surface of the accommodation space and a second surface opposite to the first surface, and
   wherein the electrode is disposed on the first surface and the ground is disposed on the second surface.

3. The aerosol generating device of claim 1, wherein the printed circuit board comprises a flexible printed circuit board (FPCB).

4. The aerosol generating device of claim 1, wherein the ground comprises mesh-type ground.

5. The aerosol generating device of claim 2, wherein a size of an area of the ground is 5% to 50% of a size of an area of the second surface of the printed circuit board.

6. The aerosol generating device of claim 1, wherein the heater comprises:
   a coil configured to generate an alternating magnetic field; and
   a susceptor heated by the magnetic field generated by the coil to heat the aerosol generating article inserted into the accommodation space, wherein the sensor is disposed between the accommodation space and the coil.

7. The aerosol generating device of claim 2, wherein the sensor further comprises:
   a first via hole passing through the first surface and the second surface; and
   a first conductive via disposed in the first via hole and electrically connected to the ground.

8. The aerosol generating device of claim 7, wherein the first via hole and the first conductive via are disposed in one region of the printed circuit board adjacent to an inlet of the accommodation space.

9. The aerosol generating device of claim 8, wherein the first conductive via shields noise introduced into the electrode from outside of the aerosol generating device.

10. The aerosol generating device of claim 7, wherein at least a part of the first conductive via protrudes from the first surface in a direction toward the accommodation space.

11. The aerosol generating device of claim 7, wherein the sensor further comprises:
    a second via hole passing through the first surface and the second surface and spaced apart from the first via hole; and
    a second conductive via disposed in the second via hole and electrically connected to the ground.

12. The aerosol generating device of claim 11, wherein the second via hole is spaced apart from the first via hole in a longitudinal direction of the housing.

13. The aerosol generating device of claim 12, wherein the second conductive via shields noise introduced into the electrode from inside of the housing.

14. The aerosol generating device of claim 13, wherein at least a part of the second conductive via protrudes from the first surface toward the accommodation space.

15. The aerosol generating device of claim 1, wherein the processor is configured to detect whether a magnitude of the sensing signal generated by the sensor is greater than or equal to a specified threshold value, and when it is detected that the magnitude of the sensing signal is greater than or equal to the specified threshold value, supply specific power to the heater.

* * * * *